United States Patent
Jiang et al.

(10) Patent No.: US 10,295,872 B2
(45) Date of Patent: May 21, 2019

(54) DISPLAY SUBSTRATE, DISPLAY DEVICE AND MANUFACTURING METHOD THE SAME

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Liangliang Jiang, Beijing (CN); Haifeng Wang, Beijing (CN); Lei Guo, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 88 days.

(21) Appl. No.: 15/537,671

(22) PCT Filed: Sep. 14, 2016

(86) PCT No.: PCT/CN2016/098949
§ 371 (c)(1),
(2) Date: Jun. 19, 2017

(87) PCT Pub. No.: WO2017/121143
PCT Pub. Date: Jul. 20, 2017

(65) Prior Publication Data
US 2018/0046013 A1 Feb. 15, 2018

(30) Foreign Application Priority Data

Jan. 15, 2016 (CN) .......................... 2016 1 0028824

(51) Int. Cl.
*G02F 1/1345* (2006.01)
*H01L 51/50* (2006.01)
(Continued)

(52) U.S. Cl.
CPC ........ *G02F 1/13454* (2013.01); *G02F 1/1343* (2013.01); *G02F 1/133514* (2013.01);
(Continued)

(58) Field of Classification Search
USPC .......................................... 345/46
See application file for complete search history.

(56) References Cited

U.S. PATENT DOCUMENTS 6,710,366 B1 * 3/2004 Lee .................. B82Y 10/00
257/103
2004/0150979 A1 8/2004 Lambertini et al.
(Continued)

FOREIGN PATENT DOCUMENTS

| CN | 1684566 A | 10/2005 |
| CN | 102255019 A | 11/2011 |

(Continued)

OTHER PUBLICATIONS

The First Chinese Office Action dated Jan. 31, 2018; Appln. No. 201610028824.9.
(Continued)

*Primary Examiner* — Chineyere D Wills-Burns
(74) *Attorney, Agent, or Firm* — Ladas & Parry LLP; Loren K. Thompson (57) ABSTRACT

A display substrate, display device and manufacturing method the same are provided. The display device includes an ordered porous thin film; a plurality of sub-pixel regions arranged in a matrix, a plurality of pore passages being disposed in each sub-pixel region, each pore passage having an opening on the surface of the ordered porous thin film; a (Continued)

plurality of quantum dots respectively arranged in at least part of the plurality of pore passages; and a first electrode layer and a second electrode layer respectively arranged on two sides of the ordered porous thin film, the second electrode layer including a plurality of sub-electrodes spaced apart from each other and respectively corresponding to the plurality of sub-pixel regions. The display substrate, display device and their manufacturing method have relatively high color gamut and quantum dots light-emitting efficiency.

19 Claims, 6 Drawing Sheets (51) Int. Cl.
    *G02F 1/1335*     (2006.01)
    *G02F 1/1343*     (2006.01)
    *G02F 1/1362*     (2006.01)
    *H01L 27/32*     (2006.01)

(52) U.S. Cl.
    CPC .. *G02F 1/133602* (2013.01); *G02F 1/136209* (2013.01); *H01L 51/502* (2013.01); *G02F 2202/36* (2013.01); *H01L 27/3244* (2013.01)

(56) References Cited

U.S. PATENT DOCUMENTS

| | | | |
|---|---|---|---|
| 2005/0206306 A1 | 9/2005 | Perlo et al. | |
| 2007/0020779 A1* | 1/2007 | Stavis | A61K 49/0056 438/14 |
| 2007/0224713 A1* | 9/2007 | Han | H01L 24/95 438/26 |
| 2010/0296845 A1* | 11/2010 | Hirakawa | H01J 1/312 399/168 |
| 2011/0227960 A1* | 9/2011 | Cho | G02F 1/133602 345/690 |
| 2011/0284819 A1 | 11/2011 | Kang et al. | |
| 2014/0124802 A1* | 5/2014 | Do | H01L 25/0753 257/89 |
| 2015/0002788 A1* | 1/2015 | Guo | G02F 1/133603 349/69 |
| 2015/0042612 A1* | 2/2015 | Lee | G02F 1/13338 345/174 |
| 2015/0194467 A1 | 7/2015 | Zhang et al. | |
| 2015/0380654 A1* | 12/2015 | Tang | H01L 51/502 257/13 |
| 2016/0218141 A1 | 7/2016 | Cai | |
| 2016/0369993 A1* | 12/2016 | Hikmet | F21V 3/06 |
| 2018/0011231 A1* | 1/2018 | Jiang | G02F 1/1335 |

FOREIGN PATENT DOCUMENTS

| | | |
|---|---|---|
| CN | 103345884 A | 10/2013 |
| CN | 103346154 A | 10/2013 |
| CN | 105204104 A | 12/2015 |
| CN | 105609535 A | 5/2016 |
| JP | 0878769 A | 3/1996 |

OTHER PUBLICATIONS

International Search Report and Written Opinion dated Dec. 16, 2016; PCT/CN2016/098949.

* cited by examiner

DISPLAY SUBSTRATE, DISPLAY DEVICE AND MANUFACTURING METHOD THE SAME

TECHNICAL FIELD

Embodiments of the present disclosure relate to a display substrate, and a display device and a manufacturing method the same.

BACKGROUND

A liquid crystal display generally forms different colors of light by a light mixing effect after utilizing a color filter layer included in the liquid crystal display to filter white light for example emitted by a backlight module so as to implement color display. The material of the color filter layer includes dye small molecules and can adsorb a part of light emitted by the backlight module, and thus, light-emitting efficiency of the color filter layer is limited; moreover, the backlight module generally uses a Light-Emitting Diode (LED) as a light source, a half peak width of the light emitted by the LED is relatively large and a color of light formed by interaction of the light emitted by the LED and the material of the color filter layer is impure.

A quantum dot, as a novel semiconductor nanomaterial, has various unique nano properties. Particularly, the quantum dot is uniform in particle size and high in light-emitting efficiency, and it can emit red light, green light or blue light and the like with a relatively narrow half peak width after being excited by light or electricity, and can greatly promote a color gamut of display, and thus, the quantum dot is widely applied to implementation of wide color gamut display.

SUMMARY

Embodiments of the present disclosure provide a display substrate, a display device and manufacturing method the same, which can increase the color gamut and light-emitting efficiency of a display.

At least one embodiment of the present disclosure provides a display device. The display device comprises an ordered porous thin film, a plurality of quantum dots, and a first electrode layer and a second electrode layer which are respectively arranged on two sides of the ordered porous thin film. The ordered porous thin film includes a plurality of sub-pixel regions arranged in a matrix, a plurality of pore passages being disposed in each sub-pixel region, an angle which is not zero being formed between an extending direction of each pore passage and a surface of the ordered porous thin film, and each pore passage having an opening at least on the surface of the ordered porous thin film. The plurality of quantum dots are arranged in at least part of the plurality of pore passages, respectively. The second electrode layer includes a plurality of sub-electrodes spaced apart from each other, the plurality of sub-electrodes respectively corresponding to the plurality of sub-pixel regions.

At least one embodiment of the present disclosure provides a method for manufacturing a display device. The method comprises: forming a first electrode layer; forming an ordered porous thin film, which includes a plurality of sub-pixel regions arranged in a matrix, a plurality of pore passages being formed in each sub-pixel region, an angle which is not zero being formed between an extending direction of each pore passage and a surface of the ordered porous thin film, and each pore passage having an opening at least on the surface of the ordered porous thin film, filling quantum dots to enable each pore passage of at least part of the pore passages to be filled with the quantum dots; and forming a second electrode layer to enable the second electrode layer to be formed on a side of the ordered porous thin film, which is away from the first electrode layer, and include a plurality of sub-electrodes spaced apart from each other, the plurality of sub-electrodes respectively corresponding to the plurality of sub-pixel regions.

At least one embodiment of the present disclosure provides a display substrate. The display substrate comprises: an ordered porous thin film, a plurality of quantum dots, and a first electrode layer and a second electrode layer which are respectively arranged on two sides of the ordered porous thin film. The ordered porous thin film includes a plurality of sub-pixel regions arranged in a matrix, a plurality of pore passages being disposed in each sub-pixel region, an angle which is not zero being formed between an extending direction of each pore passage and a surface of the ordered porous thin film, and each pore passage having an opening on the surface of the ordered porous thin film. The plurality of quantum dots are arranged in at least part of the plurality of pore passages, respectively. The second electrode layer includes a plurality of sub-electrodes spaced apart from each other, the plurality of sub-electrodes respectively corresponding to the plurality of sub-pixel regions.

BRIEF DESCRIPTION OF THE DRAWINGS

In order to demonstrate clearly technical solutions of the embodiments of the present disclosure, the accompanying drawings in relevant embodiments or technical solutions of the present disclosure will be introduced briefly. It is apparent that the described drawings just relate to some embodiments of the disclosure and not intended to limit the present disclosure.

DETAILED DESCRIPTION

Technical solutions according to the embodiments of the present disclosure will be described clearly and fully as below in conjunction with the accompanying drawings of embodiments of the present disclosure. It is apparent that the described embodiments are just a part but not all of the embodiments of the disclosure. Based on the described embodiments herein, an ordinary skill in the art can obtain other embodiment(s), without any creative work, which shall be within the scope of the present disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right" or the like are only used to indicate relative position relationship, and when the position of the object which is described is changed, the relative position relationship may be changed accordingly.

In research, the inventors of the application noticed that in an instance that using a quantum dot as a backlight source in a backlight module of a liquid crystal display and matching and utilizing a color filter layer formed by a color filter material, color display can be implemented and a color gamut is improved, however, in such instance, light-emitting efficiency and utilization rate of the quantum dot are relatively low, and due to a requirement for using the color filter layer formed by the color filter material, the improvement range of the color gamut is limited.

Embodiments of the present disclosure provide a display substrate, a display device and a manufacturing method the same. The display device includes an ordered porous thin film, a plurality of quantum dots, and a first electrode layer and a second electrode layer which are respectively arranged on two sides of the ordered porous thin film. The ordered porous thin film includes a plurality of sub-pixel regions arranged in a matrix, a plurality of pore passages are formed in each sub-pixel region, an angle which is not zero is formed between an extending direction of each pore passage and a surface of the ordered porous thin film, and each pore passage has an opening at least on the surface of the ordered porous thin film; the plurality of quantum dots included in the display device are respectively arranged in at least part of the plurality of pore passages; and the second electrode layer includes a plurality of sub-electrodes spaced apart from each other, the plurality of sub-electrodes respectively corresponding to the plurality of sub-pixel regions.

In one hand, the display substrate, the display device and their manufacturing method, which are provided in the embodiments of the present disclosure, can significantly improve the display color gamut of the display device; on the other hand, compared with the way of using the quantum dot as the backlight source, the embodiments of the present disclosure can greatly improve the light-emitting efficiency and the utilization rate of the quantum dot; and in yet another hand, in the embodiments of the present disclosure, a quantum dot light-emitting display device actively emitting light can be formed, so that power consumption can be reduced.

Figure 1:
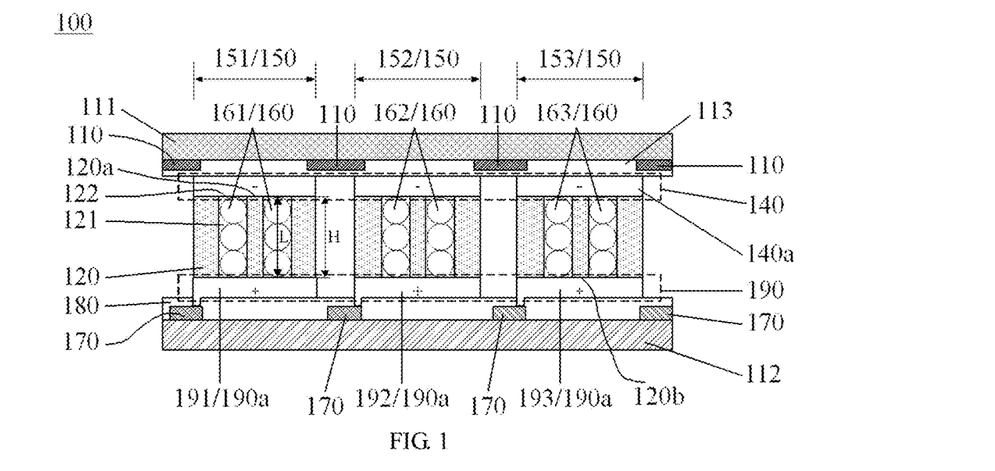
FIG. 1 is a sectional schematic diagram of a display device in an embodiment of the present disclosure.

As shown in FIG. 1, at least one embodiment of the present disclosure provides a display device 100. The display device 100 includes an ordered porous thin film 120; the ordered porous thin film 120 includes a plurality of sub-pixel regions 150 (FIG. 1 only shows a first sub-pixel region 151, a second sub-pixel region 152 and a third sub-pixel region 153) arranged in a matrix, a plurality of pore passages 121 are formed in each sub-pixel region 150, an angle which is not zero is formed between an extending direction of each pore passage 121 and a surface 120a of the ordered porous thin film 120, and each pore passage 121 has an opening 122 at least on the surface 120a of the ordered porous thin film 120; the display device 100 further includes a plurality of quantum dots 160, and the plurality of quantum dots 160 are respectively arranged in at least part of the plurality of pore passages 121; and the display device 100 further includes a first electrode layer 140 and a second electrode layer 190 which are respectively arranged on two sides of the ordered porous thin film 120. The second electrode layer 190 includes a plurality of sub-electrodes 190a (FIG. 1 only shows three sub-electrodes 191, 192 and 193) spaced apart from each other, and the plurality of sub-electrodes 190a respectively correspond to the plurality of sub-pixel regions 150.

The extending direction of each pore passage 121 refers to a direction from an end portion of each pore passage 121, which is provided with the opening 122, to an end portion of the pore passage, which is away from the opening 122.

The plurality of sub-electrodes 190a included in the second layer electrode 190 respectively corresponding to the plurality of sub-pixel regions 150 refers to that the plurality of sub-electrodes 190a are respectively overlapped with the plurality of sub-pixel regions 150 in a direction from the first electrode layer 140 to the second electrode layer 190. For example, as shown in FIG. 1, in the direction from the first electrode layer 140 to the second electrode layer 190, the sub-electrode 191 is overlapped with the first sub-pixel region 151, the sub-electrode 192 is overlapped with the second sub-pixel region 152, and the sub-electrode 193 is overlapped with the third sub-pixel region 153.

In the embodiment shown in FIG. 1, the first electrode layer 140 is close to the surface 120a of the ordered porous thin film 120, and the second electrode layer 190 is away from the surface 120a of the ordered porous thin film 120. Certainly, positions of the first electrode layer 140 and the second electrode layer 190 may also be exchanged.

Moreover, as shown in FIG. 1, the first electrode layer 140 may also include a plurality of sub-electrodes 140a. For example, the sub-electrodes 140a included in the first electrode layer 140 may correspond to the sub-electrodes 190a included in the second electrode layer 190 one by one.

The working principle of the display device 100, as shown in FIG. 1, provided by the embodiments of the present disclosure is as follows: in a working process of the display device 100, the first electrode layer 140, the second electrode layer 190 and a quantum dot array positioned therebetween may form a plurality of light-emitting units arranged in a matrix, and each light-emitting unit includes a light-emitting layer (including the sub-pixel region 150 and the quantum dots in the sub-pixel region 150), and the sub-electrode 140a and the sub-electrode 190a which correspond to the light-emitting layer, for each light-emitting unit, one of the sub-electrode 140a and the sub-electrode 190a included in the light-emitting unit is used as an anode and the other one is used as a cathode (in FIG. 1, the sub-electrode 140a is used as the cathode and the sub-electrode 190a is used as the anode, respectively with reference to "−" and "+" in FIG. 1), the anode can charge the quantum dots 160 in the sub-pixel region 150, and a current channel may be formed between the cathode and the anode, so that the quantum dots 160 in the sub-pixel region 150 can be excited to emit light under the action of the cathode and the anode; and a quantum dot array light-emitting device can be formed by controlling a light-emitting state of the quantum dots in the sub-pixel region included in each light-emitting.

For example, a display device 100 provided by an embodiment of the present disclosure may further include a plurality of transistors 170 spaced apart from each other, and as shown in FIG. 1, the plurality of transistors 170 are electrically connected with the plurality of sub-electrodes 190a included in the second electrode layer 190, respectively. In a working process of the display device 100, the plurality of transistors 170 are respectively used as switching elements of the light-emitting units, so that the light-emitting states of the quantum dots 160 in each line and each column of sub-pixel regions 150 can be controlled.

For example, the transistor 170 may be a Thin Film Transistor (TFT). The embodiment of the present disclosure includes, but is not limited thereto.

For example, an insulating layer 180 may also be disposed on the transistors 170, and source electrodes or drain electrodes of the transistors 170 are electrically connected with a plurality of sub-electrodes 190a included in the second electrode layer 190 through, for example, via holes in the insulating layer 180, respectively.

For example, the display device 100 may include a first base substrate 111 and a second base substrate 112 which are opposite to each other. For example, both the first base substrate 11l and the second base substrate 112 may be glass substrates, quartz substrates, or plastic substrates, or the like.

For example, the display device 100 may be formed in a way of forming the first electrode layer 140 and the ordered porous thin film 120 on the first base substrate 111, forming the transistors 170 and the second electrode layer 190 on the second base substrate 112, and then assembling the first base substrate 111 and the second base substrate 112 oppositely to each other; or, the display device 100 may also be formed in a way of forming the first electrode layer, the ordered porous thin film, the second electrode layer and the transistors on one base substrate, and then assembling the base substrate and the other base substrate oppositely to each other.

For example, the display device 100 may also include one base substrate, and be formed in a way of forming the first electrode layer, the ordered porous thin film, the second electrode layer and the transistors on the base substrate.

For example, a black matrix 110 positioned between the adjacent sub-pixel regions 150 of the ordered porous thin film 120 may be arranged on the first base substrate 111, and the black matrix 110 can avoid crosstalk of, for example, different colors of light emitted by the quantum dots in different sub-pixel regions 150 so as to improve the color gamut. The black matrix 110, for example, is formed by black photoresist.

For example, a planarization layer 113 covering the black matrix 110 may also be arranged on the first base substrate 111, and a surface of the planarization layer 113, which is away from the black matrix 110, is a plane roughly.

For example, in the display device 100 provided by at least one embodiment of the present disclosure, at least one of the first electrode layer 140 and the second electrode layer 190 is transparent to enable the light emitted by the quantum dots to be transmitted out, so that the display device 100 can implement single-sided light emitting, or double-sided light emitting. Certainly, the light emitted by the quantum dots may also be guided out in other common ways in the art.

For example, the first electrode layer and/or the second electrode layer may be made from materials including a transparent conductive material, such as a transparent conductive metal oxide material of indium tin oxide, or the like. For example, the first electrode layer and the second electrode layer may also adopt a metal layer which is made relatively thin so as to be transparent, and for example, the metal layer may be made from a metal material, such as aluminium, molybdenum, copper, zirconium, titanium, or the like. In order to allow the light emitted by the quantum dots to transmit through the metal layer, for example, the metal layer may have a thickness from 300 nm (nanometer) to 1 μm (micrometer).

For example, in the display device 100 provided by an embodiment of the present disclosure, at least one quantum dot column is arranged in each of the at least part of the pore passages 121, and each quantum dot column includes one quantum dot, or at least two quantum dots arranged along the extending direction of the pore passage 121 (in FIG. 1, illustration is carried out by taking a case that one quantum dot column is arranged in each pore passage and the quantum dot column includes three quantum dots as an example); both ends of each quantum dot column are respectively in contact with the first electrode layer and the second electrode layer, i.e., one end of each quantum dot column, which is close to the first electrode layer, is in physical contact with the first electrode layer and one end of the quantum dot column, which is close to the second electrode layer, is in physical contact with the second electrode layer. In this way, a current channel can be formed between the first and second electrode layers by the quantum dots positioned therebetween.

In an instance that the two ends of each quantum dot column are respectively in contact with the first electrode layer and the second electrode layer, for example, in the direction from the first electrode layer 140 to the second electrode layer 190, a height L of each quantum dot column may be greater than or equal to a distance H between the first electrode layer 140 and the second electrode layer 190 (in FIG. 1, illustration is carried out by taking a case that L and H are equal to each other as an example).

In addition to the way of enabling the two ends of each quantum dot column to be respectively in contact with the first electrode layer and the second electrode layer, the current channel may also be formed between the first and second electrode layers in other ways, which is not limited in the embodiments of the present disclosure.

For example, in the display device 100 provided by an embodiment of the present disclosure, a plurality of quantum dots 160 positioned in the ordered porous thin film 120 may include various quantum dots which can be excited to emit different colors of light, and the various quantum dots are respectively arranged in different sub-pixel regions. By arranging various quantum dots which can be excited to emit different colors of light, color display can be implemented.

For example, as shown in FIG. 1, the quantum dots 160 positioned in the ordered porous thin film 120 include a first quantum dot 161, a second quantum dot 162, and a third quantum dot 163. The first quantum dot 161 is positioned in the first sub-pixel region 151, the second quantum dot 162 is positioned in the second sub-pixel region 152, and the third quantum dot 163 is positioned in the third sub-pixel region 153. For example, the first quantum dot 161 is excited to emit blue light, the second quantum dot 162 is excited to emit green light, and the third quantum dot 163 is excited to emit red light.

It is noted that types of the quantum dots 160 are not limited to the three types, and may also be two types, or more than three types. For example, the quantum dots in the ordered porous thin film may include a plurality of first quantum dots and a plurality of second quantum dots, and the second quantum dots and the first quantum dots are respectively positioned in different sub-pixel regions and can emit different colors of light.

The ordered porous thin film is a thin film formed by an ordered porous material. The ordered porous material is a novel nanostructured material developed quickly in the 1990s, and has the characteristics that pore passages are uniform in size and are arranged regularly, a pore diameter of the pore passages can be continuously regulated in a certain range, or the like. According to definition of International Union of Pure and Applied Chemistry (IUPAC), the ordered porous materials may be classified into three types according to pore diameters thereof: the ordered porous material of which the pore diameter is smaller than 2 nm (nanometer) is a micro-porous material, the ordered porous material of which the pore diameter is in a range of 2 nm to 50 nm is a meso-porous material, the ordered porous material of which the pore diameter is greater than 50 nm is a macro-porous material, and sometimes, the ordered porous material of which the pore diameter is smaller than 0.7 nm is called as a super-microporous material.

In the embodiments of the present disclosure, a size of the opening of the pore passage may be designed according to the sizes of the quantum dots (a range of an average size of the quantum dots is 2 nm to 200 nm) so as to avoid excessive quantum dots entering in the pore passage, which is caused by the larger size of the pore passage, and resulting low light-emitting efficiency of the quantum dots.

For example, in the display device 100 provided by at least one embodiment of the present disclosure, an average size of the openings 122 of the at least part of the pore passages 121 may be 2 nm to 200 nm.

For example, in the display device 100 provided by an embodiment of the present disclosure, the average size of the openings 122 of the at least part of the pore passages 121 preferably is 2 nm to 20 nm, this is because that an average size of the common quantum dots is 2 nm to 20 nm.

For example, one quantum dot column 160 can be arranged in each pore passage of the at least part of the pore passages 121 by controlling the size of the pore passage in the ordered porous thin film, and each quantum dot column includes one quantum dot or at least two quantum dots arranged roughly along the extending direction of the pore passage. For one random pore passage 121, in an instance that a plurality of irregularly-arranged quantum dots are arranged in the pore passage 121, a probability of generating aggregation and self-quenched phenomena among the quantum dots 160 in the pore passage is relatively high, resulting in reduction of the light-emitting efficiency of the quantum dots. According to the embodiments of the present disclosure, the light-emitting efficiency of the quantum dots 160 in the pore passage 121 can be improved by arranging one quantum dot column in the pore passage.

For example, in the display device 100 provided by at least one embodiment of the present disclosure, a ratio of the average size of the openings 122 of the at least part of the pore passages 121 to the average size of the quantum dots 160 may be greater than 1 and smaller than 2. In this way, in a process of immersing the ordered porous thin film into quantum dot solution to fill the quantum dots into the pore passages, it is beneficial for enabling one quantum dot column to enter each of at least part of the pore passages 121 so as to improve the light-emitting efficiency of the quantum dots.

Various quantum dots emitting different colors of light are generally different in size, and thus, the average size of the openings of the pore passages in the ordered porous thin film 120 may be set to be completely the same, and may also be set respectively according to the sizes of the quantum dots arranged therein.

For example, in the display device 100 provided by at least one embodiment of the present disclosure, the ordered porous thin film 120 may be made from a material including a metal oxide, such as aluminium oxide, titanium dioxide, or the like. For example, the ordered porous thin film 120 may include a porous anodic aluminum oxide film or a titanium dioxide nanotube array film.

Figure 2A:
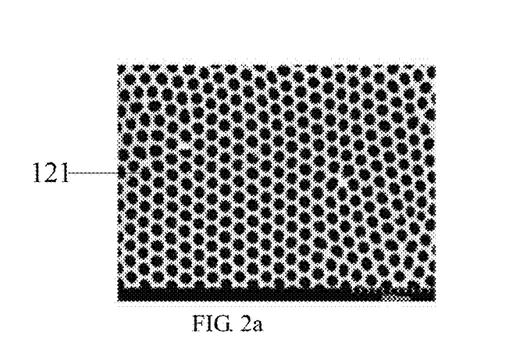
FIG. 2a and FIG. 2b are microstructural schematic diagrams of a pore passage of an ordered porous thin film in a display device of an embodiment of the present disclosure.
Figure 2B:
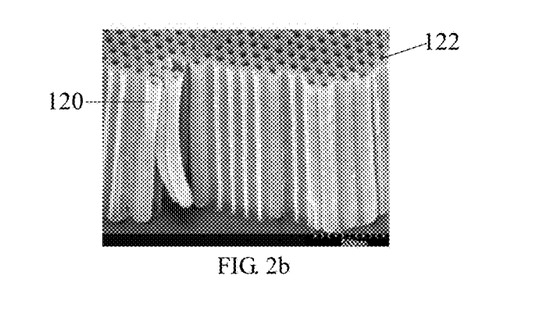

The porous anodic aluminum oxide film is generally formed in a way of forming an aluminium metal thin film and anodizing the aluminium metal thin film. The porous Anodic Aluminum Oxide (AAO) film has the advantages of ability of forming the highly ordered pore passages, controllability of the pore diameters and pore distances of the pore passages, high thermal stability, insulating, simple preparing process, and the like; and moreover, the porous anodic aluminum oxide film is also a wide band gap material, it has the excellent optical characteristics and has very high light transmission in near ultraviolet to infrared bands. As shown in FIG. 2a and FIG. 2b, a periodic pore passage with a pore diameter of 5 nm to 200 nm can be prepared in the porous anodic aluminum oxide film, and the pore passage can be basically perpendicular to a substrate for bearing the porous anodic aluminum oxide film. Therefore, compared with an ordered porous aluminum oxide film formed by other common methods in the art, the porous anodic aluminum oxide film formed by adopting an anodizing method is more beneficial for filling the quantum dots and enabling the light emitted by the quantum dots to emerge; and the embodiments of the present disclosure, by filling the quantum dots in the pore passage of the porous anodic aluminum oxide film and producing the quantum dot light-emitting display device by utilizing the electroluminescent characteristics of the quantum dots, can greatly improve the light-emitting efficiency and the utilization rate of the quantum dots and promote the display color gamut of the quantum dot light-emitting display device.

For example, when the ordered porous thin film 120 includes the porous anodic aluminum oxide film, the forming material of the first electrode layer 140 or the second electrode layer 190 may include molybdenum metal. This is because the difference between the coefficients of thermal expansion of the molybdenum metal and the aluminium metal is small, and when the aluminium metal thin film is formed by a magnetron sputtering process or the like, for example, on the first electrode layer or the second electrode layer made from the molybdenum metal, so as to form the porous anodic aluminum oxide film in a subsequent step, it is rare that a fracture phenomenon is happened in the formed aluminium metal thin film when it is cooled to the room temperature; and on the other hand, compared with a way of directly forming the aluminium metal thin film on a substrate (e.g., a glass substrate, a quartz substrate, or the like), the way adopted by the embodiments of the present disclosure has a good bonding force between the molybdenum metal and the aluminium metal thin film, and thus, a falling off probability of the aluminium metal thin film can be reduced.

For example, the ordered porous thin film 120 may also be the titanium dioxide nanotube array film, a surface layer of the titanium dioxide nanotube array film may be formed into a morphology similar as the porous anodic aluminum oxide film, and the underlying of the surface is a nanotube ordered array. For example, the nanotubes may have a diameter from 20 nm to 100 nm.

Since the pore passage of which the pore diameter is approximate to the size of the quantum dot and the extending direction is basically perpendicular to the surface of the porous anodic aluminum oxide film is easier to be formed in the porous anodic aluminum oxide film, in the embodiments of the present disclosure, the ordered porous thin film preferably is the porous anodic aluminum oxide film.

Of course, the embodiments of the present disclosure include, but are not limited to, the porous anodic aluminum oxide film, the titanium dioxide nanotube array film, or any ordered porous thin film with the characteristics that the pore passage is excellent in perpendicularity, the pore diameter of the pore passage is approximate to the size of the quantum dot, and the like, can be used in the embodiments of the present disclosure.

In the display device 100 provided by the embodiments of the present disclosure, the extending direction of the pore passage is perpendicular to the surface 120a of the ordered porous thin film 120 to the greatest extent, which is beneficial for enabling the light emitted by the quantum dots 160 in the pore passage 121 to pass through the pore passage (i.e., avoiding irradiation to an inner wall of the pore passage 121) so as to improve the utilization rate of the light emitted by the quantum dots 160.

For example, in the display device 100 provided by at least one embodiment of the present disclosure, an average value of the angle formed between the extending direction of each pore passage 121 and the surface 120a of the ordered porous thin film 120 is in a range of 60° to 90°.

For example, further, the average value of the angles between the extending directions of the pore passages 121 and the surface 120a of the ordered porous thin film 120 is in a range of 80° to 90°.

In FIG. 1, illustration is carried out by taking a case that the first electrode layer 140 includes a plurality of sub-electrodes 140a, and the sub-electrodes 140a included in the first electrode layer 140 correspond to the sub-electrodes 190a included in the second electrode layer 190 as an example, however, the embodiments of the present disclosure include, but are not limited to thereto. For example, the first electrode layer 140 may also be continuously formed, as shown in FIG. 3.

Figure 4:
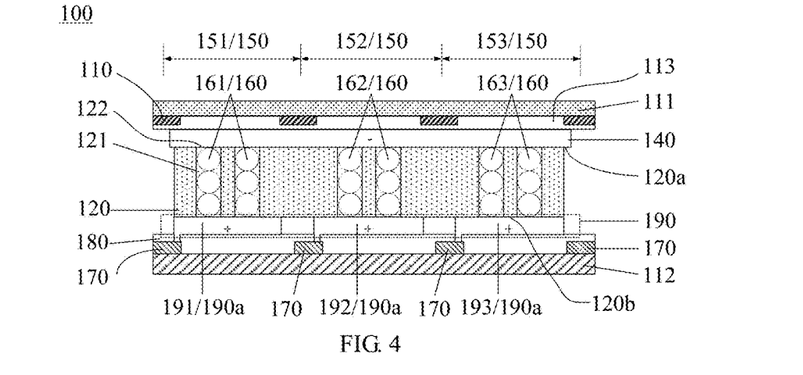
FIG. 4 is a schematic diagram of a display device in an embodiment of the present disclosure.

For example, as shown in FIG. 4, the ordered porous thin film 120 may also be continuously formed. That is, as long as the second electrode layer in the embodiments of the present disclosure includes a plurality of sub-electrodes which are insulated from each other and correspond to the sub-pixel regions 150 of the ordered porous thin film, a plurality of light-emitting units can be formed so as to realize the quantum dot array display device.

Figure 3:
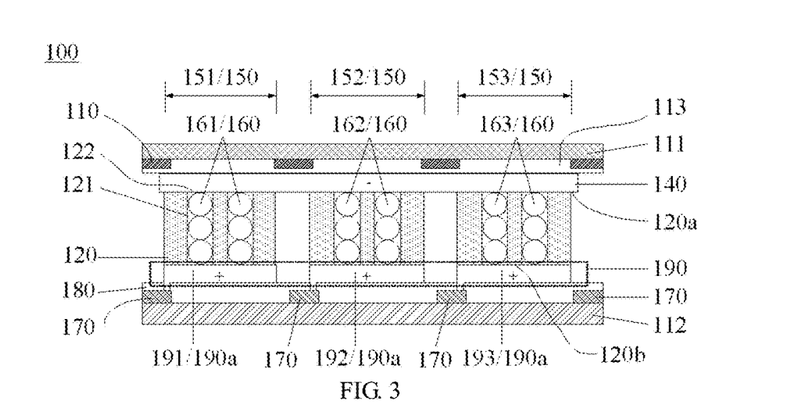
FIG. 3 is a schematic diagram of a display device in an embodiment of the present disclosure.
Figure 5:
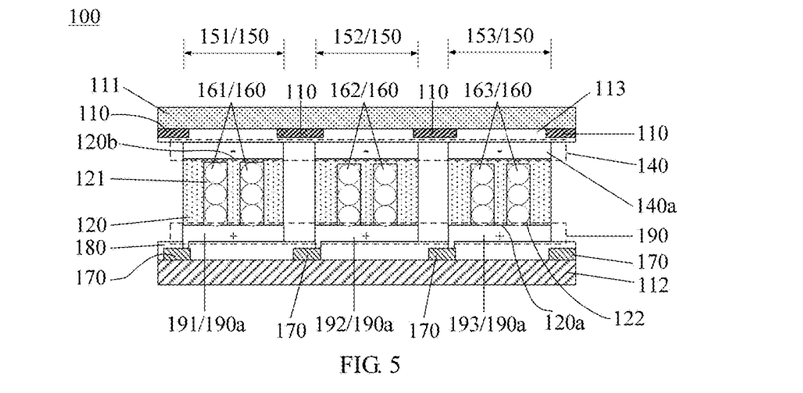
FIG. 5 is a schematic diagram of a display device in an embodiment of the present disclosure.

In the embodiments shown in FIG. 1, FIG. 3 and FIG. 4, each pore passage 121 is a through hole running through the ordered porous thin film 120 (i.e., each pore passage 121 is provided with openings at the positions of the surface 120a and surface 120b of the ordered porous thin film 120, which are opposite). Certainly, each pore passage 121 may be provided with the opening only on one surface of the ordered porous thin film 120, i.e., each pore passage 121 is a blind hole, as shown in FIG. 5.

In the embodiments shown in FIG. 1 and FIG. 3 to FIG. 5, the transistor 170 for controlling the light-emitting state of the quantum dots in each sub-pixel region is arranged between the ordered porous thin film 120 and the second base substrate 112. In some embodiments, the transistor 170 may be arranged between the ordered porous thin film 120 and the first base substrate 111 according to actual demands.

Moreover, the display device 100 provided by the embodiments of the present disclosure may also include structures, e.g., a driving circuit, a gate line, a data line and the like, which are not repeated in the embodiments of the present disclosure.

Embodiments of the present disclosure provide a manufacturing method for the display device 100 provided by any of the embodiments. As shown in FIG. 1 and FIG. 3 to FIG. 5, the manufacturing method includes the step S1 to the step S4 below.

S1: forming the first electrode layer 140.

S2: forming the ordered porous thin film 120 and enabling the ordered porous thin film 120 include a plurality of sub-pixel regions 150 arranged in a matrix, a plurality of pore passages 121 being formed in each sub-pixel region 150, the angle which is not zero being formed between the extending direction of each pore passage 121 and the surface 120a of the ordered porous thin film 120, and each pore passage 121 has the opening 122 at least on the surface 120a of the ordered porous thin film 120.

S3: filling the quantum dots 160 to enable each pore passage of at least part of the pore passages 121 included in each sub-pixel region 150 to be filled with the quantum dots.

S4: forming the second electrode layer 190 to enable the second electrode layer 190 to include a plurality of sub-electrodes 190a spaced apart from each other, the plurality of sub-electrodes 190a respectively corresponding to the plurality of sub-pixel regions 150.

The display device manufactured by the method provided by the embodiments of the present disclosure is wide in display color gamut and high in light-emitting efficiency and utilization rate of the quantum dots, and is low in power consumption due to adoption of an active type light-emitting mode.

The manufacturing method provided by the embodiments of the present disclosure does not limit a sequence of the steps above. For example, the first electrode layer, or the second electrode layer, and the ordered porous thin film may be simultaneously formed; and for example, the forming sequences of the first electrode layer and the second electrode layers can be interchanged.

Figure 6A:
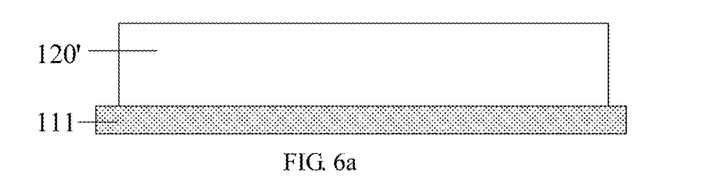
FIG. 6a and FIG. 6b are sectional schematic diagrams of forming an ordered porous thin film and a first electrode layer by utilizing a metal thin film in an embodiment of the present disclosure.
Figure 6B:
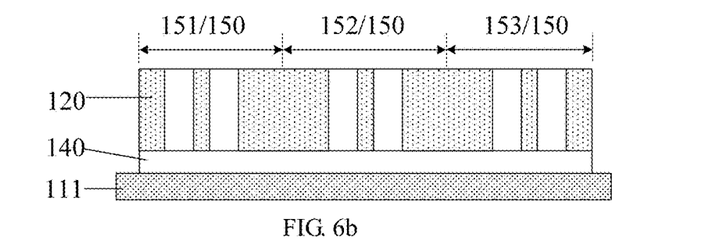

For example, in the manufacturing method of the display device, which is provided by at least one embodiment of the present disclosure, the step S2 of forming the ordered porous thin film 120 may include: forming a metal thin film 120', as shown in FIG. 6a; and anodizing the metal thin film 120' to form the ordered porous thin film 120, as shown in FIG. 6b.

In this step, for example, the metal thin film 120' may include an aluminium metal layer, or a titanium metal layer, or the like. For example, the metal thin film 120' may include the aluminium metal layer and a molybdenum metal layer. The embodiments of the present disclosure include, but are not limited thereto.

For example, the metal thin film 120' may be deposited on the first base substrate 111 (as shown in FIG. 6a) or the second base substrate by a magnetron sputtering process or the like common in the art.

When the metal thin film is processed by the anodizing method to form the ordered porous thin film, the pore diameter of the pore passage in the formed ordered porous thin film is suitable for filling the quantum dots and the pore passage is good in perpendicularity.

By taking an instance that the metal thin film 120' is the aluminium metal thin film as an example, a process of processing the aluminium metal thin film by the anodizing method to prepare the ordered porous thin film 120 may include step S21 to step S23 below.

S21: performing a first oxidizing process.

For example, in an oxalic acid solution of 0.25 to 0.4 mol/L, a direct current voltage of 35 to 45 V is kept, a constant temperature is kept by adopting an ice-water bath, and the temperature is lower than the room temperature by about 10° C. An aluminium metal thin film is oxidized for 3 to 5 hours (specific time can be regulated according to a structure which needs to be obtained), for example.

S22: after completing the first oxidizing process, flushing the structure obtained by the step S21, and drying the structure.

For example, distilled water can be used for flushing by a spraying device.

S23: performing a second oxidizing process.

The structure obtained by the step S22 is placed into a mixed solution of phosphoric acid (a weight ratio is 5 to 8%) and chromic acid (a weight ratio is 1 to 2%), which is at a temperature of 80° C., the $Al_2O_3$ film formed on the surface of the aluminium metal thin film by the first oxidizing process is etched off, the second oxidizing process is carried out on a surface of a hexagonal pit array structure formed after the first oxidizing process, other conditions of the second oxidizing process are consistent with those of the first oxidizing process, and the second oxidizing process is performed for about 8 to 11 hours.

The above process of producing the porous anodic aluminum oxide film by adopting the anodizing method is merely used for exemplary description. The embodiments of the present disclosure include, but are not limited to thereto. Moreover, those skilled in the art can regulate and control the diameter, shape, periodicity and the like of the pore passage formed in the ordered porous thin film by regulating a manufacturing process of the porous anodic aluminum oxide film (for example, by regulating acid solution types, conditions of oxidation, or the like), which is not repeated herein.

When the titanium metal layer is adopted, the titanium dioxide nanotube array film of which the pore passage has good perpendicularity and the pore diameter suitable for filling the quantum dots can be prepared by adopting a common method in the art, which is not repeated herein.

In an embodiment shown in FIG. 6b, the metal thin film 120' is partially oxidized. In this case, for example, one portion (i.e., a metal oxide layer formed due to oxidation) of the metal thin film 120' in a thickness direction may form the ordered porous thin film 120 and the other portion (i.e., the un-oxidized metal thin film) forms the first electrode layer 140 (as shown in FIG. 6b) or the second electrode layer. i.e., the step S (or the step S4) and the step S2 may be simultaneously performed.

Figure 7A:
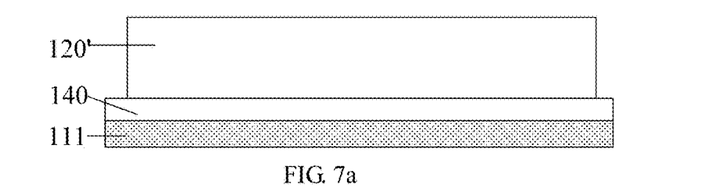
FIG. 7a and FIG. 7b are sectional schematic diagrams of oxidizing a whole metal thin film to form an ordered porous thin film in an embodiment of the present disclosure.
Figure 7B:
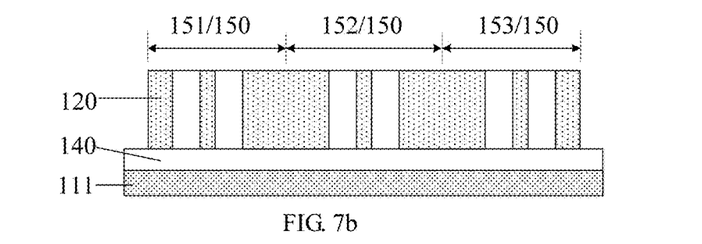

In at least one embodiment of the present disclosure, the metal thin film 120' may also be totally oxidized. For example, the first electrode layer 140 (as shown in FIG. 7a) or the second electrode layer and the metal thin film 120' are sequentially formed on the first base substrate 111; then, the metal thin film 120' is totally oxidized to form the ordered porous thin film 120, as shown in FIG. 7b. In other words, the step S1 or the step S4 and the step S2 may be sequentially performed.

For example, when the metal thin film 120' shown in FIG. 7a is the aluminium metal thin film, the first electrode layer 140 (as shown in FIG. 7a) or the second electrode layer may be a molybdenum metal layer so as to reduce the probability of fracture occurring in the aluminium metal thin film formed on the first electrode layer or the second electrode layer.

In at least one embodiment of the present disclosure, the step S1 may further include: patterning (for example, the patterning process may be a photolithography process including steps of exposure, development, etching, and the like, or other processes for forming a set pattern) a conductive thin film for forming the first electrode layer so as to enable the first electrode layer to include a plurality of sub-electrodes. In at least one embodiment of the present disclosure, the step S2 may further include: patterning the ordered porous material which is obtained by a anodizing process and used for forming the ordered porous thin film so as to enable the sub-pixel regions included in the formed ordered porous thin film to be separated from each other. Description will be carried out in the following with reference to FIG. 8a to FIG. 8c.

Figure 8A:
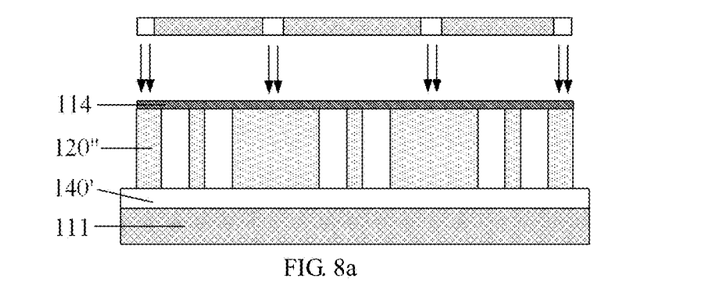
FIG. 8a to FIG. 8c are sectional schematic diagrams of patterning a produced ordered porous material to form an ordered porous thin film including a plurality of sub-pixel regions separated from each other in an embodiment of the present disclosure.
Figure 8B:
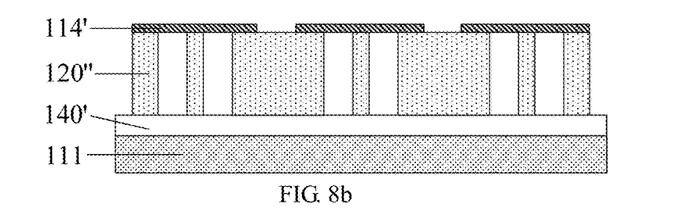
Figure 8C:
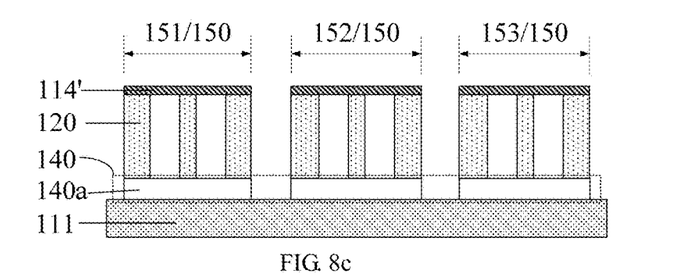

For example, as shown in FIG. 8a, photoresist 114 is formed on the conductive thin film 140' and the ordered porous thin film 120" which are sequentially formed on the first base substrate 111, and is subjected to an exposure process with a mask; then development is carried out to form a photoresist pattern 114', and the photoresist 114' exposes part of the surface of the ordered porous material 120", as shown in FIG. 8b; then, the ordered porous material 120" and the conductive thin film 140' are etched, so that the formed ordered porous thin film 120 includes sub-pixel regions 150 separated from each other, and the formed first electrode layer 140 includes a plurality of sub-electrodes 140a, as shown in FIG. 8c.

After the ordered porous thin film is formed, the step S3 of filling the quantum dots into the ordered porous thin film can be carried out. By taking an instance that respectively filling the first quantum dot 161, the second quantum dot 162 and the third quantum dot 163 excited to emit different colors of light into the first to third sub-pixel regions 151, 152 and 153 of the ordered porous thin film as an example, the step S3 may include the step S31 to the step S36 below, and the step S3 will be described in the following with reference to FIG. 9a to FIG. 9f.

Figure 9A:
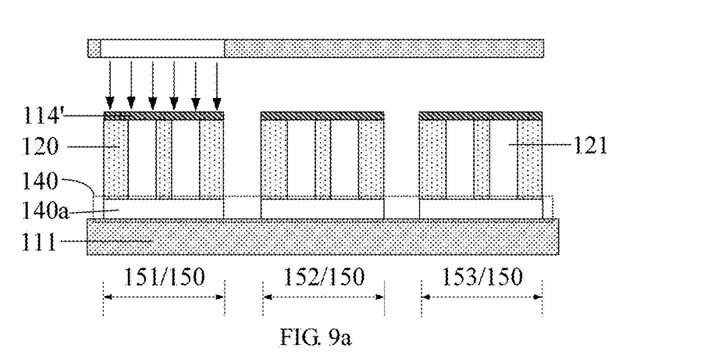
FIG. 9a to FIG. 9f are sectional schematic diagrams of filling quantum dots in an embodiment of the present disclosure.
Figure 9B:
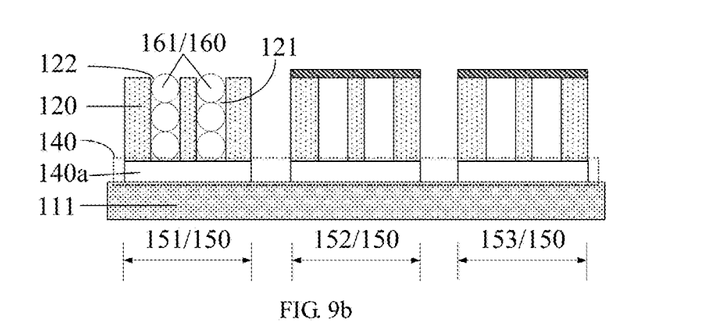

S31: as shown in FIG. 9a, forming the photoresist (for example, forming the photoresist pattern 114' as shown in FIG. 9a) on the ordered porous thin film 120, the photoresist covering the first sub-pixel region 151, the second sub-pixel region 152 and the third sub-pixel region 153; exposing the photoresist on the first sub-pixel region 151 with the mask, as shown in FIG. 9a; and then the developing process is performed to expose the opening 122 of the pore passage 121 in the first sub-pixel region 151, as shown in FIG. 9b.

S32: immersing the ordered porous thin film 120 into a first quantum dot solution, so that each of at least part of the pore passages 121 in the first sub-pixel region 151 is filled with at least one column of first quantum dots 161, as shown in FIG. 9b.

In this step, the first quantum dot solution may be prepared by dispersing a first quantum dot material into a common solvent in the art, such as water, ethanol, acetone, or the like.

Figure 9C:
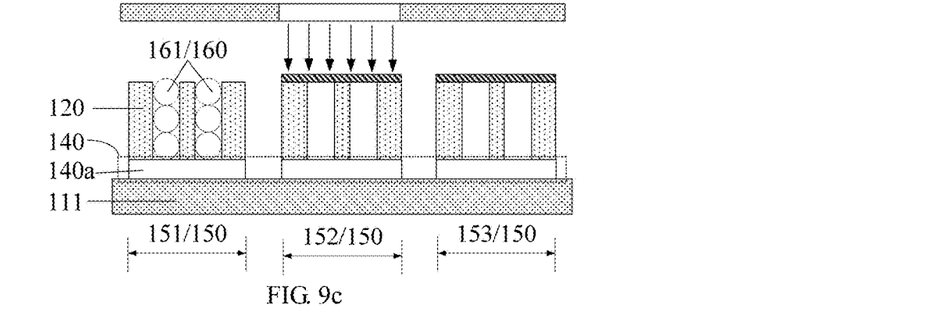
Figure 9D:
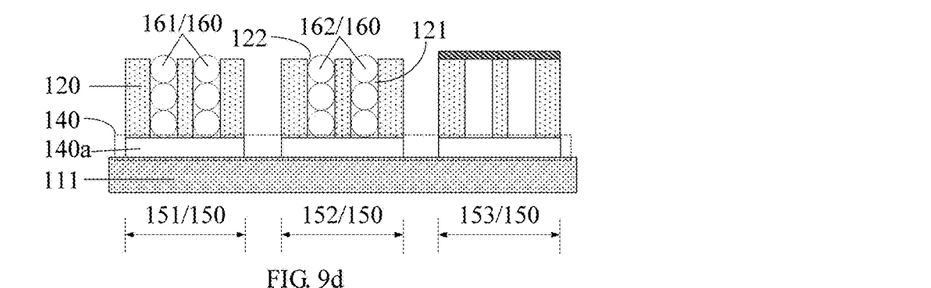

S33: exposing the photoresist on the second sub-pixel region 152 with the mask, as shown in FIG. 9c; then a developing process is performed to expose the opening 122 of the pore passage 121 in the second sub-pixel region 152, as shown in FIG. 9d.

S34: immersing the ordered porous thin film 120 into a second quantum dot solution, so that each of at least part of the pore passages 121 in the second sub-pixel region 152 is filled with at least one column of second quantum dots 162, as shown in FIG. 9d.

In this step, the second quantum dot solution may be prepared by dispersing a second quantum dot material into a common solvent in the art, such as water, ethanol, acetone, or the like.

Figure 9E:
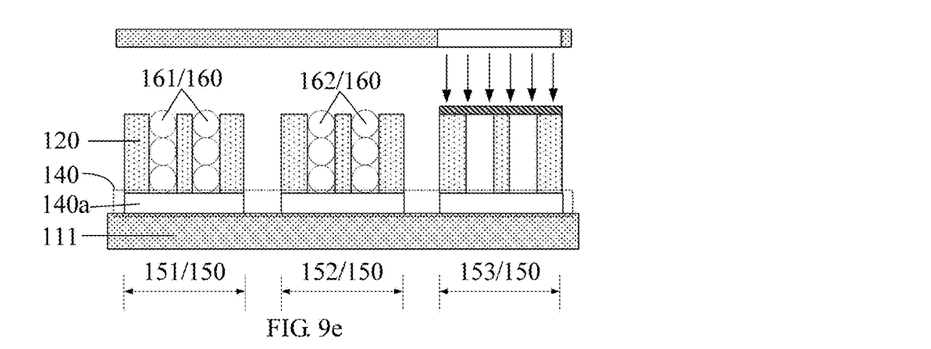
Figure 9F:
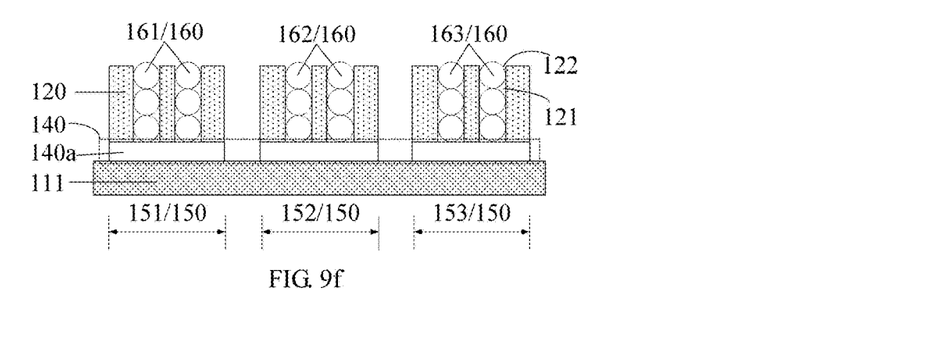

S35: exposing the photoresist on the third sub-pixel region 153, as shown in FIG. 9e, then a developing process is performed to expose the opening 122 of the pore passage 121 in the third sub-pixel region 153, as shown in FIG. 9f.

S36: immersing the ordered porous thin film 120 into a third quantum dot solution, so that each of at least part of the pore passages 121 in the third sub-pixel region 153 is filled with at least one column of third quantum dots 163.

In this step, the third quantum dot solution may be prepared by dispersing a third quantum dot material into a common solvent in the art, such as water, ethanol, acetone or the like.

The above steps S31 to step S36 are merely described by taking three types of quantum dots as examples. When the types of the quantum dots are two types, or more than three types, a filling method of the quantum dots can refer to the steps above. Moreover, the above merely exemplarily describes how to fill different types of quantum dots into different pixel regions, however, the quantum dots may be filled into the pore passages by using other methods common in the art.

In the manufacturing method provided by at least one embodiment of the present disclosure, the first electrode layer in the step S1 and the second electrode layer in the step S4 can be respectively formed on two base substrates. For example, in the manufacturing method of the display device, which is provided by an embodiment of the present disclosure, as shown in FIG. 6b, FIG. 7B and FIG. 9f, the first electrode layer 140 and the ordered porous thin film 120 are formed on the first base substrate 111; as shown in FIG. 10, the second electrode layer 190 is formed on the second base substrate 112; and the first base substrate 111 and the second base substrate 112 are disposed oppositely to each other to form the display device as shown in any one of FIG. 1 and FIG. 3 to FIG. 5.

For example, in order to enable two ends of each quantum dot column in the pore passage of the ordered porous thin film to be respectively in close contact with the first electrode layer and the second electrode layer so as to form a current channel between the first and second electrode layer, when the first base substrate and the second base substrate are disposed oppositely to each other, the second electrode layer on the second base substrate can be arranged in close contact with the surface of the ordered porous thin film on the first base substrate to the greatest extent.

For example, when the quantum dots of which the light-emitting efficiency may be reduced when encountering water or water vapor is filled in the ordered porous thin film, the first base substrate and the second base substrate can be disposed oppositely to each other under the vacuum condition so as to avoid the water vapor in the air affecting the light emission of the quantum dots.

Figure 10:
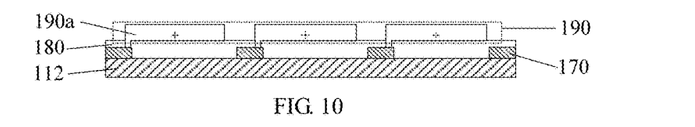
FIG. 10 is a sectional schematic diagram of forming a plurality of transistors and a second electrode layer on a second base substrate in an embodiment of the present disclosure.

For example, the manufacturing method of the display device, which is provided by an embodiment of the present disclosure, may also include: forming a plurality of transistors 170 in a matrix on the second base substrate 112, enabling the second electrode layer 190 to cover the plurality of transistors and enabling the plurality of sub-electrodes 190a included in the second electrode layer 190 to be electrically connected with the plurality of transistors 170 through the via holes in the insulating layer 180, respectively, for example, as shown in FIG. 10. The manufacturing process can be simplified by disposing the base substrates oppositely to each other after the ordered porous thin film and the transistors are respectively formed on different base substrates.

In the manufacturing method provided by at least one embodiment of the present disclosure, the first electrode layer in the step S1 and the second electrode layer in the step S4 may also be formed on the same base substrate.

Figure 11:
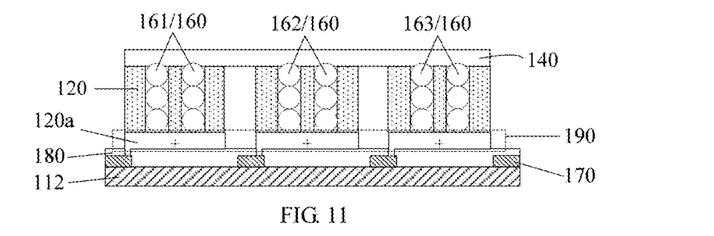
FIG. 11 is a sectional schematic diagram of directly forming a continuous first electrode layer on an ordered porous thin film in an embodiment of the present disclosure.

For example, as shown in FIG. 11, a continuous first electrode layer 140 can be formed on the ordered porous thin film 120 by a magnetron sputtering process after the second electrode layer 190 and the ordered porous thin film 120 are formed.

Figure 12A:
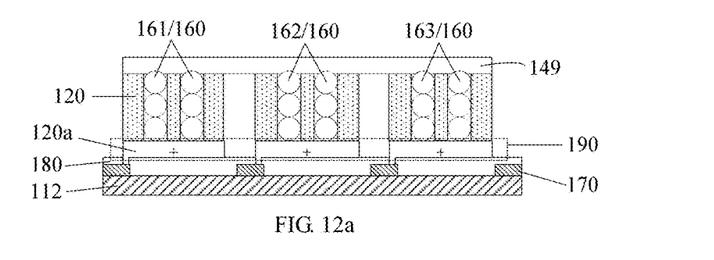
FIG. 12a and FIG. 12b are sectional schematic diagrams of forming a first electrode layer by a patterning process after forming an electrode thin film on an ordered porous thin film in an embodiment of the present disclosure.
Figure 12B:
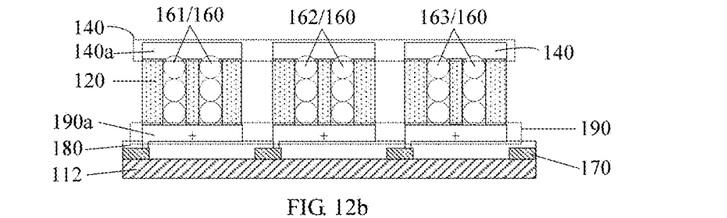

For example, an electrode thin film 149 may also be formed on the ordered porous thin film 120 by a magnetron sputtering process after the second electrode layer 190 and the ordered porous thin film 120 are formed, as shown in FIG. 12a; then patterning the electrode thin film 149 to form the first electrode layer 140, the first electrode layer 140 including a plurality of sub-electrodes 140a separated from each other, as shown in FIG. 12b. The second electrode layer may also be formed in a similar way, i.e., after the first electrode layer and the ordered porous thin film are formed, an electrode thin film is formed on the ordered porous thin film by a magnetron sputtering process, then patterning the electrode thin film to form the second electrode layer.

The embodiment above adopts the magnetron sputtering process to form the electrode layer (the first electrode layer, or second electrode layer) on the ordered porous thin film, which is beneficial for enabling the material of the electrode layer to be filled into the pore passage of the ordered porous thin film and beneficial for enabling the electrode layer to be in close contact with the quantum dots in the pore passage. Moreover, in this case, a height of each quantum dot column in the pore passage along the direction from the first electrode layer to the second electrode layer may be greater than a distance between the first electrode layer and the second electrode layer.

The magnetron sputtering process above can adopt a magnetron sputtering process common in the art, and is not repeated herein.

When the first electrode layer and the second electrode layer are formed on the same base substrate, the display device provided by the embodiments of the present disclosure, for example, may only include one base substrate, so that the step of disposing two base substrates oppositely to each other is omitted.

The above mainly describes the steps of forming the first and second electrode layers and the ordered porous thin film and filling the quantum dots. Moreover, the manufacturing method of the display device, which is provided by some embodiments of the present disclosure, may also include a step of forming film layers, such as black matrix, an insulating layer, which is not repeated herein.

The manufacturing method of the display device, which is provided by the embodiments above of the present disclosure, is described exemplarily, and the embodiments of the present disclosure include, but are not limited thereto.

Figure 13:
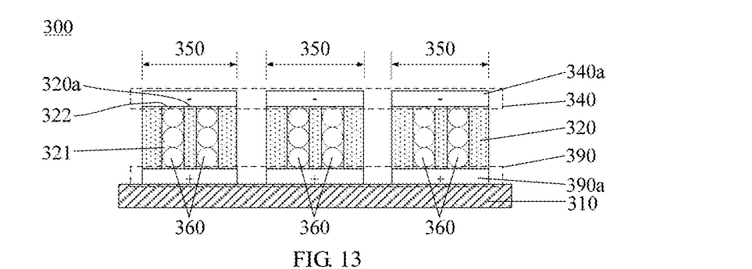
FIG. 13 is a sectional schematic diagram of a display substrate in an embodiment of the present disclosure.

At least one embodiment of the present disclosure also provides a display substrate 300. As shown in FIG. 13, the display substrate 300 includes an ordered porous thin film 320, the ordered porous thin film 320 including a plurality of sub-pixel regions 350 arranged in a matrix, a plurality of pore passages 321 being formed in each sub-pixel region 350, an angle being formed between an extending direction of each pore passage 321 and a surface 320a of the ordered porous thin film 320, and each pore passage 321 having an opening 322 at least on the surface 320a of the ordered porous thin film 320. The display substrate 300 further includes a plurality of quantum dots 360, the plurality of quantum dots 360 being respectively arranged in at least part of the plurality of pore passages 321; and the display substrate 300 further includes a first electrode layer 340 and a second electrode layer 390 which are respectively arranged on two sides of the ordered porous thin film 321, the second electrode layer 190 including a plurality of sub-electrodes 390a spaced apart from each other, and the plurality of sub-electrodes respectively corresponding to the plurality of sub-pixel regions 350.

The extending direction of each pore passage 321 refers to a direction from an end portion of each pore passage 321, which is provided with the opening 322, to an end portion of the pore passage, which is away from the opening 322.

The plurality of sub-electrodes 390a included in the second layer electrode 390 respectively corresponding to the plurality of sub-pixel regions 350 refers to that the plurality of sub-electrodes 390a are respectively overlapped with the plurality of sub-pixel regions 350 in a direction from the first electrode layer 340 to the second electrode layer 390.

The working principle of the display substrate provided by the embodiments of the present disclosure is similar as the working principle of the display device provided by any embodiments above, and is not repeated herein.

In the embodiment shown in FIG. 13, the second electrode layer 390 is positioned between the ordered porous thin film 320 and the base substrate 310 for bearing the ordered porous thin film 320. Certainly, it is also possible that the first electrode layer 340 may be positioned between the ordered porous thin film 320 and the base substrate 310.

In the embodiment shown in FIG. 13, the first electrode layer 340 includes a plurality of sub-electrodes 340a. For example, the sub-electrodes 340a included in the first electrode layer 340 may correspond to the sub-electrodes 390a included in the second electrode layer 390 one to one. For example, the first electrode layer 340 may also be a film layer continuously formed.

For example, the display substrate provided by the embodiments may adopt the magnetron sputtering process to form the first electrode layer, or the second electrode layer on a side of the ordered porous thin film, which is away from the base substrate 310, and a specific way can refer to the description in the embodiments of the display device 100 with reference to FIG. 6a to FIG. 7b.

For arrangements of the first and second electrode layers, the ordered porous thin film and the quantum dots in the display substrate provided by the embodiments, arrangement modes of the corresponding structures in the display device can be referred to, and are not repeated herein.

For example, the display substrate or the display device provided by any embodiments of the present disclosure can be used as the backlight source in the liquid crystal display device, and can also be any product or part with a display function, such as a mobile phone, a tablet personal computer, a television, a display, a notebook computer, a digital photo frame, a navigator, or the like.

Several points below to be noted:

(1) The drawings of the embodiments of the present disclosure may only involve structures to which the embodiments of the present disclosure relate, and other structures can refer to general design;

(2) The thickness and shape of each layer of thin film in the drawings do not reflect true scales, and only aim to exemplarily illustrate the embodiments of the present disclosure; and (3) Without conflict to each other, the embodiments of the present disclosures and characteristics in the embodiments can be combined mutually.

The foregoing is only the exemplary embodiments of the present disclosure and not intended to limit the scope of the present disclosure. The scope of the present disclosure is defined by the appended claims.

The present application claims priority to the Chinese Patent Application No. 201610028824.9 filed on Jan. 15, 2016, the disclosure of which are incorporated herein by its reference in its entirety as part of the present application.

What is claimed is:

1. A display device, comprising:
an ordered porous thin film, including a plurality of sub-pixel regions arranged in a matrix, wherein a plurality of pore passages are disposed in each sub-pixel region, an angle which is not zero is formed between an extending direction of each pore passage and a surface of the ordered porous thin film, and each pore passage has an opening at least on the surface of the ordered porous thin film;
a plurality of quantum dots, arranged in at least part of the plurality of pore passages, respectively; and
a first electrode layer and a second electrode layer which are respectively arranged on two sides of the ordered porous thin film, wherein the second electrode layer includes a plurality of sub-electrodes spaced apart from each other, the plurality of sub-electrodes respectively corresponding to the plurality of sub-pixel regions;
wherein a ratio of an average size of the openings of the plurality of pore passages to an average size of the plurality of quantum dots is greater than 1 and smaller than 2.

2. The display device according to claim 1, further comprising:
a plurality of transistors spaced apart from each other, wherein the plurality of transistors are electrically connected with the plurality of sub-electrodes included in the second electrode layer, respectively.

3. The display device according to claim 1, wherein at least one of the first electrode layer and the second electrode layer is transparent.

4. The display device according to claim 3, wherein at least one quantum dot column is arranged in each of the part of pore passages, each quantum dot column includes one quantum dot, or at least two quantum dots arranged along the extending direction of the pore passage, and adjacent quantum dots in the at least two quantum dots are in contact with each other; and in a direction from the first electrode layer to the second electrode layer, two ends of each quantum dot column are respectively in contact with the first electrode layer and the second electrode layer.

5. The display device according to claim 4, wherein the plurality of quantum dots include various quantum dots emitting different colors of light if being excited, and the various quantum dots are respectively arranged in different sub-pixel regions.

6. The display device according to claim 5, wherein the ordered porous thin film is made from a material including a metal oxide.

7. The display device according to claim 6, wherein the ordered porous thin film includes a porous anodic aluminum oxide film or a titanium dioxide nanotube array film.

8. The display device according to claim 7, wherein the ordered porous thin film includes the porous anodic aluminum oxide film; and the first electrode layer, or the second electrode layer is made from a material including molybdenum metal.

9. The display device according to claim 1, wherein along a direction in parallel to the surface of the ordered porous thin film, the average size of the openings of the plurality of pore passages is in a range of 2 nm to 200 nm.

10. The display device according to claim 9, wherein the average size of the openings of the plurality of pore passages is in a range of 2 nm to 20 nm.

11. The display device according to claim 10, wherein an average value of the angle formed between the extending direction of each pore passage and the surface of the ordered porous thin film is in a range of 60° to 90°.

12. The display device according to claim 11, wherein the average value of the angle is in a range of 80° to 90°.

13. A method for manufacturing a display device, comprising:

forming a first electrode layer;

forming an ordered porous thin film, which includes a plurality of sub-pixel regions arranged in a matrix, wherein a plurality of pore passages are formed in each sub-pixel region, an angle which is not zero is formed between an extending direction of each pore passage and a surface of the ordered porous thin film, and each pore passage at least has an opening on the surface of the ordered porous thin film;

filling quantum dots to enable each pore passage of at least part of the pore passages to be filled with the quantum dots; and forming a second electrode layer, wherein the second electrode layer is formed on a side of the ordered porous thin film, which is away from the first electrode layer, and includes a plurality of sub-electrodes spaced apart from each other, the plurality of sub-electrodes respectively corresponding to the plurality of sub-pixel regions;

wherein a ratio of an average size of the openings of the plurality of pore passages to an average size of the plurality of quantum dots is greater than 1 and smaller than 2.

14. The method according to claim 13, wherein
a metal thin film is formed, and anodizing the metal thin film to form the ordered porous thin film.

15. The method according to claim 14, wherein in a thickness direction of the metal thin film, one part of the metal thin film forms the ordered porous thin film, and the other part of the metal thin film forms the first electrode layer, or the second electrode layer.

16. The method according to claim 14, wherein after the second electrode layer and the ordered porous thin film are formed, the first electrode layer is formed on the ordered porous thin film by a magnetron sputtering process, the first electrode layer being formed continuously; or after the second electrode layer and the ordered porous thin film are formed, an electrode thin film is formed on the ordered porous thin film by a magnetron sputtering process, then, patterning the electrode thin film to form the first electrode layer, the first electrode layer including a plurality of sub-electrodes separated from each other; or after the first electrode layer and the ordered porous thin film are formed, the electrode thin film is formed on the ordered porous thin film by a magnetron sputtering process, then, patterning the electrode thin film to form the second electrode layer.

17. The method according to claim 14, wherein the first electrode layer and the ordered porous thin film are formed on a first base substrate;

the second electrode layer is formed on a second base substrate; and the first base substrate and the second base substrate are opposite to each other.

18. The method according to claim 17, further comprising:

forming a plurality of transistors arranged in a matrix on the second base substrate, wherein the plurality of sub-electrodes included in the second electrode layer are electrically connected with the plurality of transistors, respectively.

19. A display substrate, comprising:

an ordered porous thin film, including a plurality of sub-pixel regions arranged in a matrix, wherein a plurality of pore passages are formed in each sub-pixel region, an angle which is not zero is formed between an extending direction of each pore passage and a surface of the ordered porous thin film, and each pore passage has an opening on the surface of the ordered porous thin film;

a plurality of quantum dots, respectively arranged in at least part of the plurality of pore passages; and a first electrode layer and a second electrode layer respectively arranged on two sides of the ordered porous thin film, wherein the second electrode layer includes a plurality of sub-electrodes spaced apart from each other, the plurality of sub-electrodes respectively corresponding to the plurality of sub-pixel regions;

wherein a ratio of an average size of the openings of the plurality of pore passages to an average size of the plurality of quantum dots is greater than 1 and smaller than 2.

* * * * *